(12) United States Patent
Kessler et al.

(10) Patent No.: US 10,908,504 B2
(45) Date of Patent: Feb. 2, 2021

(54) IMAGER FOR LITHOGRAPHIC REPRODUCTION

(71) Applicant: Optical Associates, Inc., San Jose, CA (US)

(72) Inventors: David Kessler, New York, NY (US); Evan Keith Palmer, Mountain View, CA (US)

(73) Assignee: Optical Associates, Inc., Milpitas, CA (US)

( * ) Notice: Subject to any disclaimer, the term of this patent is extended or adjusted under 35 U.S.C. 154(b) by 308 days.

(21) Appl. No.: 16/001,098

(22) Filed: Jun. 6, 2018

(65) Prior Publication Data

US 2018/0356733 A1 Dec. 13, 2018

Related U.S. Application Data

(60) Provisional application No. 62/516,904, filed on Jun. 8, 2017.

(51) Int. Cl.
*G03F 7/20* (2006.01)
*G03F 9/00* (2006.01)
*G02B 27/28* (2006.01)

(52) U.S. Cl.
CPC .......... *G03F 7/2008* (2013.01); *G03F 7/2006* (2013.01); *G03F 7/702* (2013.01); *G03F 7/7005* (2013.01); *G03F 7/70191* (2013.01); *G03F 7/70225* (2013.01); *G03F 9/7023* (2013.01); *G02B 27/283* (2013.01)

(58) Field of Classification Search
CPC .. G03F 7/70191; G03F 7/72008; G03F 7/702; G03F 7/70225; G03F 9/7023
USPC .................................................. 355/53, 67–71
See application file for complete search history.

(56) References Cited

U.S. PATENT DOCUMENTS

| | | | |
|---|---|---|---|
| 2,231,378 A | 2/1941 | Becker et al. | |
| 5,303,001 A | 4/1994 | Jeong et al. | |
| 5,557,469 A | 9/1996 | Markle et al. | |
| 5,638,218 A * | 6/1997 | Oomura | G02B 17/08 359/639 |
| 6,351,305 B1 * | 2/2002 | Tanaka | G03F 7/70358 355/53 |
| 6,863,403 B2 | 3/2005 | Mercado et al. | |
| 7,573,655 B2 | 8/2009 | Shafer | |
| 7,956,984 B2 | 6/2011 | Tanaka et al. | |
| 2006/0238732 A1 | 10/2006 | Mercado | |
| 2015/0055228 A1 | 2/2015 | Stites | |

* cited by examiner

*Primary Examiner* — Hung Nguyen
(74) *Attorney, Agent, or Firm* — Louis S. Horvath

(57) ABSTRACT

An imaging apparatus for exposing a pattern onto a substrate has an illumination source that is energizable to generate a polarized exposure illumination beam of an actinic wavelength range and a mask disposed to impart the pattern to the polarized exposure illumination beam. A polarization beam splitter defines an illumination path that conveys the generated polarized exposure illumination beam through a quarter wave plate and plano-convex lens and toward a concave mirror and further conveys a reflected exposure illumination beam from the concave mirror toward an exposure plane for exposing the imparted pattern onto the substrate. The exposure plane is defined by the concave mirror, the plano convex lens, and the polarization beam splitter.

19 Claims, 16 Drawing Sheets

IMAGER FOR LITHOGRAPHIC REPRODUCTION

CROSS REFERENCE TO RELATED APPLICATIONS

This application claims the benefit of U.S. Provisional application U.S. Ser. No. 62/516,904, provisionally filed on Jun. 8, 2017, entitled "IMAGER FOR LITHOGRAPHIC REPRODUCTION", in the names of David Kessler and Evan Keith Palmer, incorporated herein in its entirety.

FIELD OF THE INVENTION

This disclosure generally relates to imaging apparatus and more particularly relates to an imaging apparatus that provide 1:1 imaging for lithographic reproduction.

BACKGROUND OF THE INVENTION

Apparatus for forming electronic circuitry and microelectromechanical systems (MEMS) devices use a mask, reticle, or other type of master to copy a pattern, at high resolution, onto a substrate for the device. One-to-one (1:1) imaging is conventionally used for this purpose.

Conventional optics systems for UV (ultraviolet) imaging tend to be bulky and require large and expensive precision lenses and mirrors. Materials used for the exposure optics must be capable of handling UV light at high energy levels.

It can be appreciated that there is a need for optical systems solutions that offer reduced size and physical footprint, without compromising image quality and overall optical performance.

SUMMARY OF THE INVENTION

It is an object of the present disclosure to advance the art of lithography reproduction. With this object in mind, the present disclosure provides an imaging apparatus comprising:
  a) an illumination source for generating a polarized exposure illumination beam of a first wavelength range;
  b) a polarization beam splitter disposed to reflect the incident exposure beam toward a curved mirror;
  c) a quarter wave plate in the path of the reflected exposure beam out from the polarization beam splitter and back from the curved mirror;
  d) a compensator plate in the path of light through the quarter wave plate;
  e) an exposure plane for exposure light transmitted through the polarization beam splitter;
  f) an alignment light source having a second wavelength range outside the first wavelength range and directed toward a first surface of the PBS for reflection from the mirror, toward a second surface of the PBS for reflection from a first fiducial on a wafer and toward a third surface of the PBS for reflection from a second fiducial on a mask; and
  g) one or more sensors for sensing alignment light reflected from the first and second fiducials.

From an alternate aspect, the present disclosure provides an imaging apparatus for exposing a pattern onto a substrate, the apparatus comprising:
  a) an illumination source that is energizable to generate a polarized exposure illumination beam of an actinic wavelength range;
  b) a mask disposed to impart the pattern to the polarized exposure illumination beam; and
  c) a polarization beam splitter that defines an illumination path that conveys the generated polarized exposure illumination beam through a quarter wave plate and plano-convex lens and toward a concave mirror, and that further conveys a reflected exposure illumination beam from the concave mirror toward an exposure plane for exposing the imparted pattern onto the substrate,
  wherein the exposure plane is defined by the concave mirror, the plano convex lens, and the polarization beam splitter.

These and other aspects, objects, features and advantages of the present invention will be more clearly understood and appreciated from a review of the following detailed description of the preferred embodiments and appended claims, and by reference to the accompanying drawings.

BRIEF DESCRIPTION OF THE DRAWINGS

While the specification concludes with claims particularly pointing out and distinctly claiming the subject matter of the present disclosure, it is believed that the invention will be better understood from the following description when taken in conjunction with the accompanying drawings.

DETAILED DESCRIPTION OF THE INVENTION

Figure 1A:
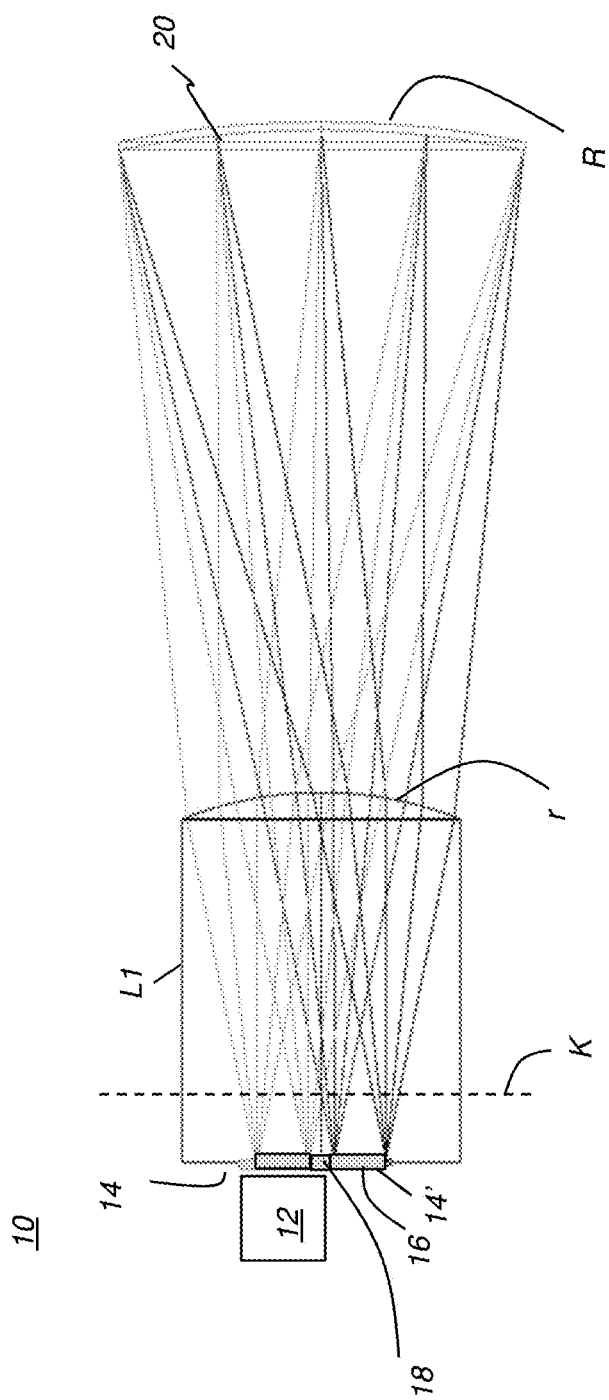
FIG. 1A is a schematic diagram that shows the basic arrangement of a conventional Dyson optical system for wafer exposure.

The present description is directed in particular to elements forming part of, or cooperating more directly with, apparatus in accordance with the invention. It is to be understood that elements not specifically shown or described may take various forms well known to those skilled in the art.

Figures shown and described herein are provided in order to illustrate key principles of operation and component relationships along their respective optical paths according to the present invention and are not drawn with intent to show actual size or scale. Some exaggeration may be necessary in order to emphasize basic structural relationships or principles of operation or simply in order to fit components within the available space on the page. Some conventional components that would be needed for implementation of the described embodiments, such as various types of optical mounts, for example, are not shown in the drawings in order to simplify description of the invention itself. In the drawings and text that follow, like components are designated with like reference numerals, and similar descriptions concerning components and arrangement or interaction of components already described are omitted. Where they are used, the terms "first", "second", and so on, do not denote any ordinal or priority relation, but are simply used to more clearly distinguish one element from another.

The term "oblique" or "oblique angle" has its conventional meaning, as relating to an angular relationship that is either greater than or less than a right (90 degree) angle and not parallel with respect to its reference, that is, not an integer multiple of 90 degrees. An oblique angle is considered to be an angle that differs from the nearest multiple of 90 degrees by more than 4 degrees.

Two geometric features, such as lines or planes, are considered to be substantially parallel if they are parallel to within 4 degrees or less. Two geometric features, such as lines or planes, are considered to be substantially orthogonal if they are orthogonal to within 4 degrees or less.

The term "optical axis" has its conventional meaning for each of the embodiments described subsequently. With rotationally symmetrical optics, the optical axis simply corresponds to the axis of rotational symmetry. However, with asymmetric optics, the optical axis is more generally defined as the path taken by a ray that is centered in the aperture of the light-concentrating optical component. For cylindrical optics, there may be an axis of symmetry with respect to a plane; this may or may not correspond to the optical axis. With a cylindrical optical device, the optical axis is in the plane where there is perceptible optical power orthogonal to the direction along which the cylindrical device is extended. For clarity, the term optical axis is used in the following description as relative to a single refractive or reflective optical component, rather than relative to the larger optical system that comprises multiple components. The more general term "optical path" is used herein to describe the path taken by a particular beam of light, from one component to the next in the optical system of the present disclosure.

With relation to dimensions given herein, the term "substantially" means within better than +/−12% of a geometrically exact dimension. Thus, for example, a first dimensional value is substantially half of a second value if it is in the range of from about 44% to about 56% of the second value. Positions in space are "near" each other or in close proximity when, relative to an appropriate reference dimension such as a radius of curvature, a focal point, a component location, or other point on an optical axis, distance dimensions are substantially the same, no more than about 12% apart, preferably within 5% or 1% or less distance from each other.

The terminology "S-polarization" and "P-polarization", familiar to those skilled in the optical arts, relates to the plane in which the electric field of a light wave oscillates and to the surface upon which the light is incident. Light having P-polarization, or "P-polarized" light, has its polarization in the meridional plane. Light having S-polarization, or "S-polarized" light, has its polarization perpendicular to the meridional plane, wherein the meridional plane is the plane that contains the surface normal and the propagation vector of the incoming and outgoing light radiation. In general, S-polarization is more highly reflected than P-polarization. Polarization beam splitters (PBS), also termed polarizing beam splitters, are commonly designed to reflect light having S-polarization and transmit light having P-polarization, although it is possible to design and implement PBS coatings that exhibit the opposite behavior.

In the context of the present disclosure, actinic light is ultraviolet (UV) light that is generated at sufficiently high energy levels and is then patterned to cause the photochemical reaction on the substrate used in lithography for circuitry and micromechanical component fabrication. According to an embodiment of the present disclosure, actinic light is at wavelengths below 380 nm.

In the context of the present disclosure, the term "fiducial" is used as a noun to describe a reference marking; the term as generally used in lithography optics is understood to be equivalent to the phrase "fiducial target" or "fiducial feature", for example.

Lithography methods for circuit and microstructure fabrication direct actinic exposure illumination through a mask or reticle onto a sensitized substrate, generally termed a "wafer", for reproduction of the mask pattern. The needed performance levels depend on the type of devices being replicated. For MEMs devices, for example, line width resolutions of 0.5 to 1 micron are suitable, with uniformity within about 1%. Highly compact electronic circuitry can require much finer resolution and optimized uniformity. Favorable characteristics of an optical system for device fabrication include telecentricity and large depth of focus.

The Dyson or Wynne-Dyson optical system is a well-corrected optical configuration that exhibits no third-order aberrations such as spherical aberration, coma, astigmatism, or distortion. The Dyson optical approach has been used for wafer lithography with varying degrees of success. FIG. 1A shows basic features of a Dyson optical system 10 that directs light energy from an energizable illumination source 12, such as a high intensity UV illumination source, through a mask 14 in order to reproduce the pattern from mask 14 as an image 14' onto a wafer 16. Basic components of this system include a concave spherical mirror 20 of radius R, a thick plano-convex lens L1 of radius r and thickness r, with refractive index n and having its convex surface concentric with mirror 20.

FIG. 1A shows Dyson optical system 10 in a conventional, unfolded configuration. Mask 14, the object of the optical system, lies on the same plane with wafer 16 where image 14' of the optical system is formed. With the FIG. 1A arrangement, the projection optics must be sized to scale for a large optical field that encompasses the object (mask 14) and its co-planar image 14'. Within the plane that contains both mask 14 and image 14', some amount of physical separation 18 is necessary between object and image components.

Figure 1B:
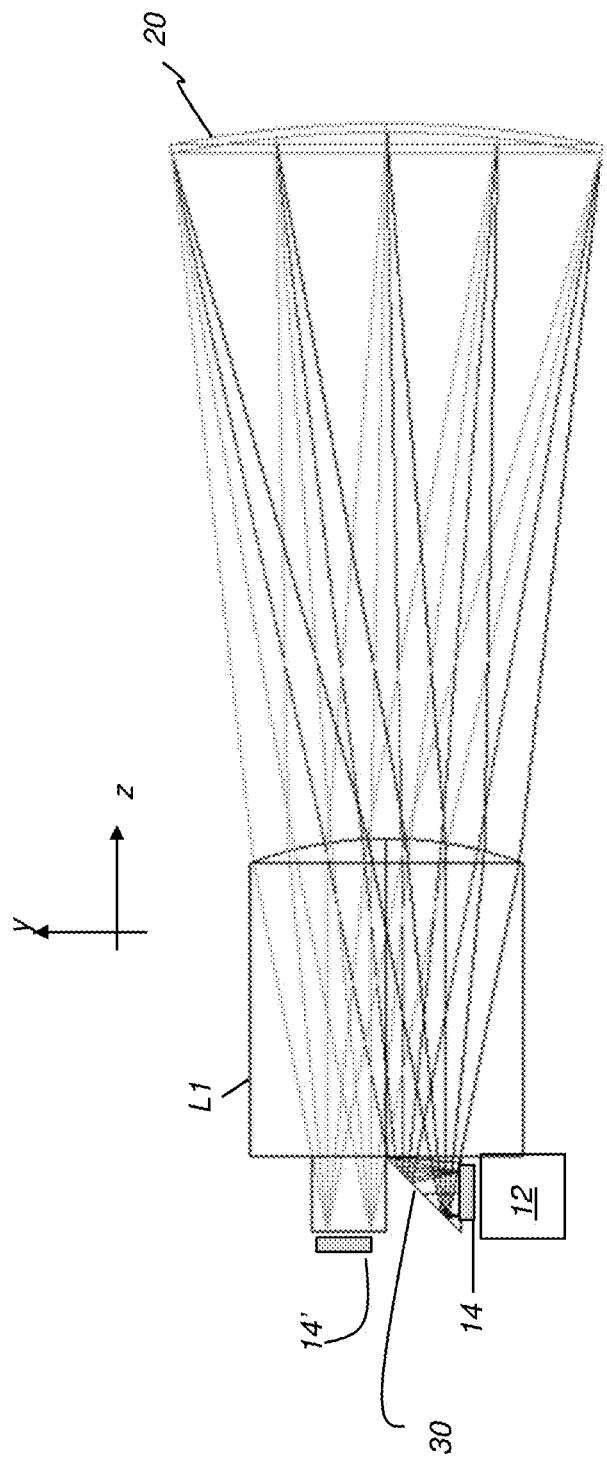
FIG. 1B is a schematic diagram that shows a folded arrangement of a conventional Dyson optical system for wafer exposure.

It can be appreciated that the requirement for the mask 14 and wafer 16 to be within the same plane places significant constraints on system mechanical design. One approach has been use of one or more prisms to fold the illumination path, such as is shown in FIG. 1B. A right-angle prism 30 serves to reposition mask 14. There are some constraints with the folded arrangement, since folding must be performed at a position outside the region of intersection of the object mask 14 and image 14' light paths, as is indicated by a line K in FIG. 1A.

By way of example, a mask 14 can be about 20×20 mm using an optical system with a numerical aperture (NA) of 0.3. In order to fold the illumination light path, about 14 mm is needed for sufficient separation 18 between the object illumination and image illumination. The right-angle folding prism would be about 34 mm in the yz plane of FIG. 1B.

Figure 1D:
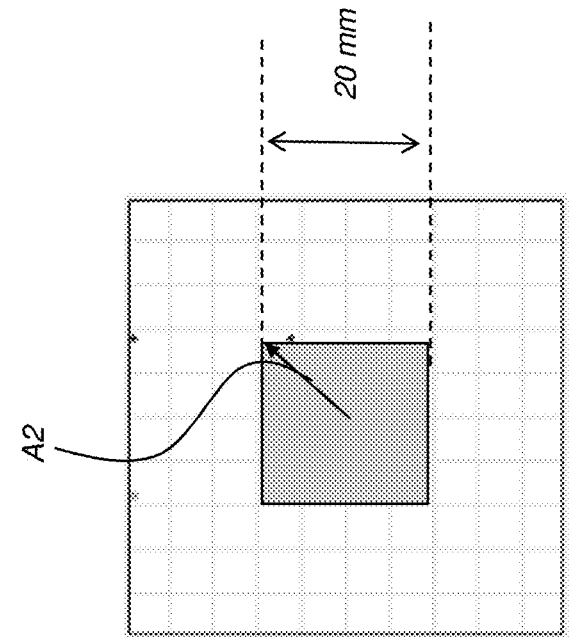
FIG. 1D shows the required field covered by the optical system of the current disclosure.
Figure 1C:
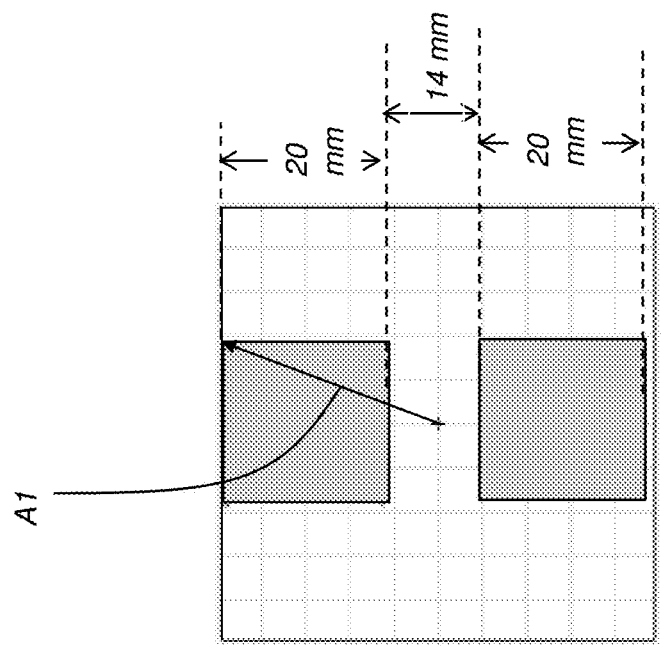
FIG. 1C shows the required field for the conventional optical systems of FIGS. 1A and 1B.

In order to appreciate the optical design challenges, it is instructive to consider the field dimensions using of conventional Dyson optics designs. The plan view of FIG. 1C shows the field having separated object and image areas using conventional approaches. For the example system just described, the maximum field indicated by the arrow A1 is about 27 mm. With a field of this size, the Dyson optics must be relatively large. For the example system just described, the total track from object mask 14 (FIG. 1A) to mirror 20 is about 600 mm. At this size, the Strehl ratio at the corner of the field is better than 0.9. Making the system shorter would reduce the Strehl Ratio, degrading image quality, and the resulting system may not be diffraction-limited.

Embodiments of the present disclosure are directed to the use of a polarizing beam splitter that optically distinguishes the object and image illumination beams according to polarization. Using the Applicants' approach with a system optical path folded using polarization, the object mask 14 is made to optically overlap onto its image 14' at the wafer. As is shown in the plan view of FIG. 1D, the required field is significantly reduced, to about 14.14 mm for the example system described. The resulting reduced field enables much smaller Dyson optics, nominally of about half the size compared to the system in FIG. 1B, reducing cost of the optics and offering equal or better performance in terms of resolution as expressed, for example, in terms of Strehl Ratio.

Figure 1E:
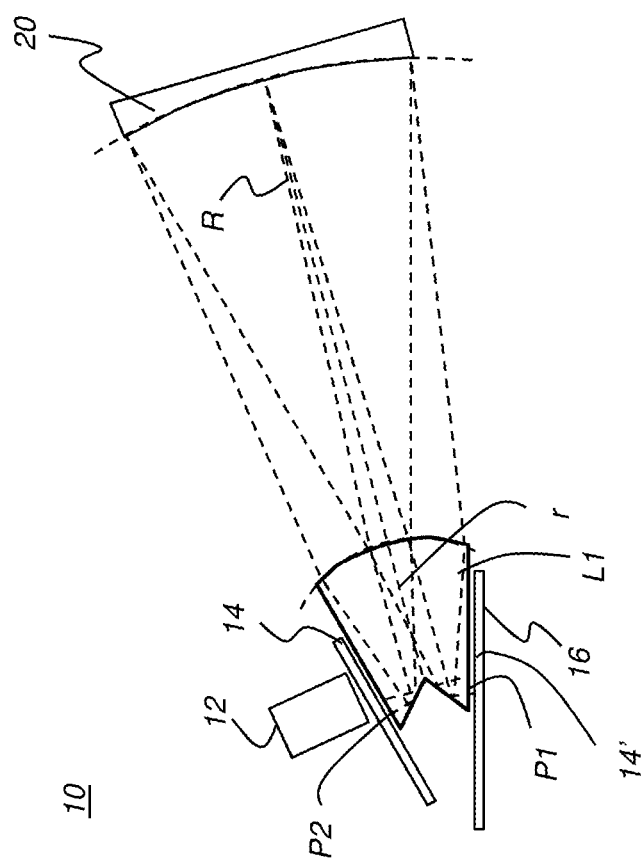
FIG. 1E shows another conventional embodiment using prisms to fold out the optical paths.

The alternate configuration of FIG. 1E is used, for example, in U.S. Pat. No. 5,303,001 entitled "Illumination system for half-field Dyson stepper" to Jeong and Shafer, wherein folding of the mask 14 and its image 14' at the wafer is accomplished with prisms other than right angle prisms to achieve two goals: (i) somewhat reducing the separation distance 18 shown in FIG. 1A and achieving some small reduction in system size and (ii) disposing the wafer at an improved angle to more easily clear the Dyson lens. However, this angular arrangement, with the mask 14 at an oblique angle to the wafer 16, complicates wafer handling and makes it difficult to provide the needed alignment.

Figure 2A:
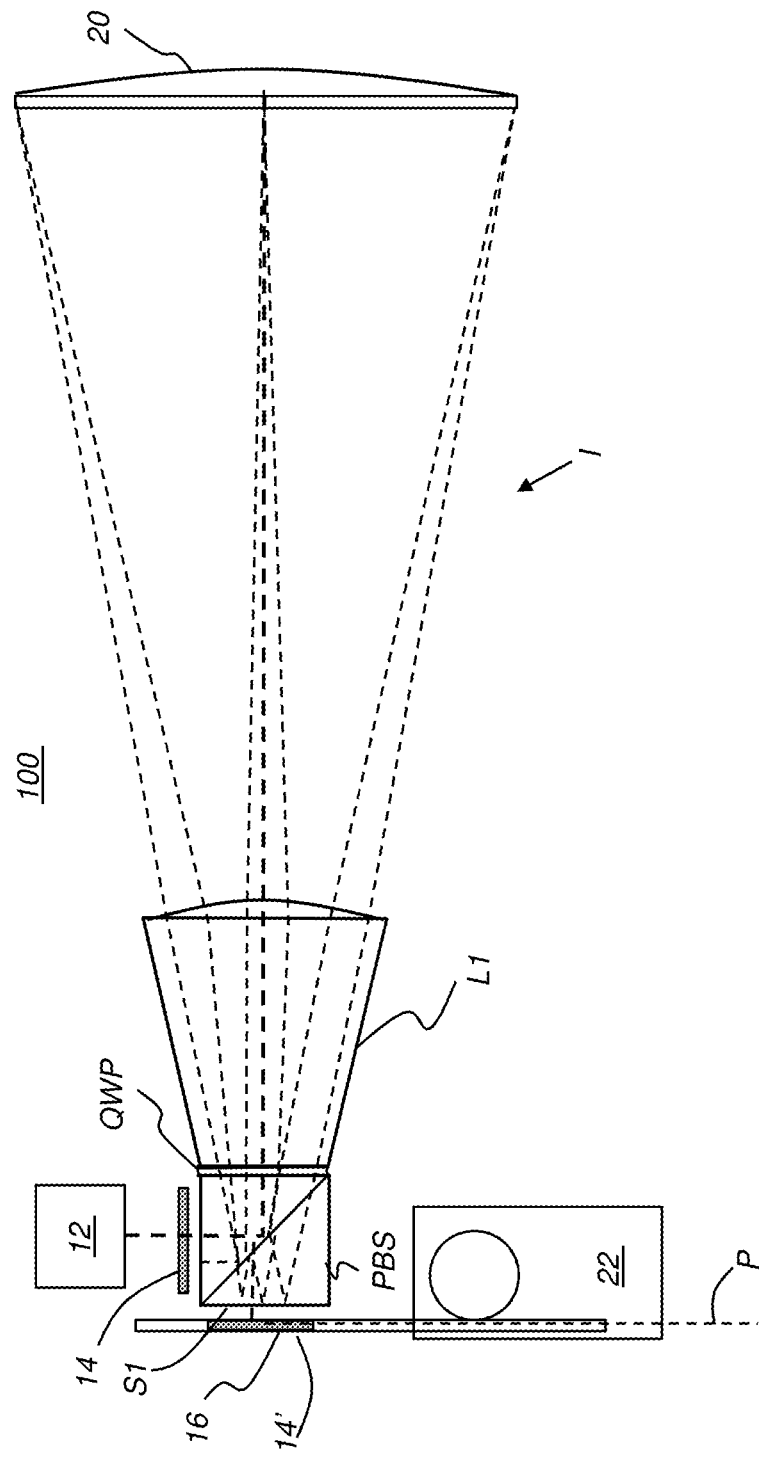
FIG. 2A shows a projection optical system for lithographic imaging according to an embodiment of the present disclosure.

FIG. 2A shows a projection optical system 100 for lithographic imaging according to an embodiment of the present disclosure, using a polarization beam splitter PBS to fold the optical path. System 100 provides a lithographic imaging apparatus with 1:1 non-contact imaging. A stepper motor or other type of linear actuator 22 can be used to index wafer 16 to successive positions for repeated lithographic exposure of the wafer 16. A quarter wave plate QWP is provided in the optical path for exposure illumination, such as between the PBS and lens L1.

In the FIG. 2A embodiment, the PBS plays a central role for routing the illumination beam, defining an illumination path I that conveys the polarized exposure beam toward concave mirror 20 and back, so that the illumination beam transits the QWP twice. This illumination path effectively changes the polarization state of the traversing illumination beam so that it can then be conveyed to expose wafer 16 along an exposure plane P that is parallel to a facing surface S1 of the PBS; the position of exposure plane P is indicated by a dashed line in FIG. 2A. The position of exposure plane P and its distance to facing surface S1 of the PBS prism, the nearest PBS surface, is defined by the optical system formed using the concave mirror 20, lens L1, and the PBS. The optical design of the lithography system is directed to optimizing the concentration, distribution uniformity, and resolution of incident light energy at the exposure plane P. According to an embodiment of the present disclosure, optical contact is maintained at junctions between the PBS, QWP, and lens L1. (In subsequent figures, however, some separation may be shown for clarity.)

Following the basic illumination path I arrangement of FIG. 2A, S-polarized light energy from illumination source 12 forms an illumination beam that is patterned at mask 14 and is reflected from the PBS and directed through planoconvex lens L1 to curved mirror 20. This first transmission through the QWP changes the illumination energy from linear to circular polarization. Reflection from curved mirror 20 directs the circularly polarized illumination back through lens L1 and again through the QWP. This second transmission through the QWP changes the patterned illumination from circular polarization to linear P-polarized light, so that its polarization axis is now orthogonal to the originally generated S-polarized light from illumination source 12. This patterned illumination beam now transmits through the PBS and exposes the mask pattern onto wafer 16 at the exposure plane P. Following exposure, actuator 22 indexes wafer 16 to the next unexposed position, and the exposure process is repeated over the next position of wafer 16.

Figure 2B:
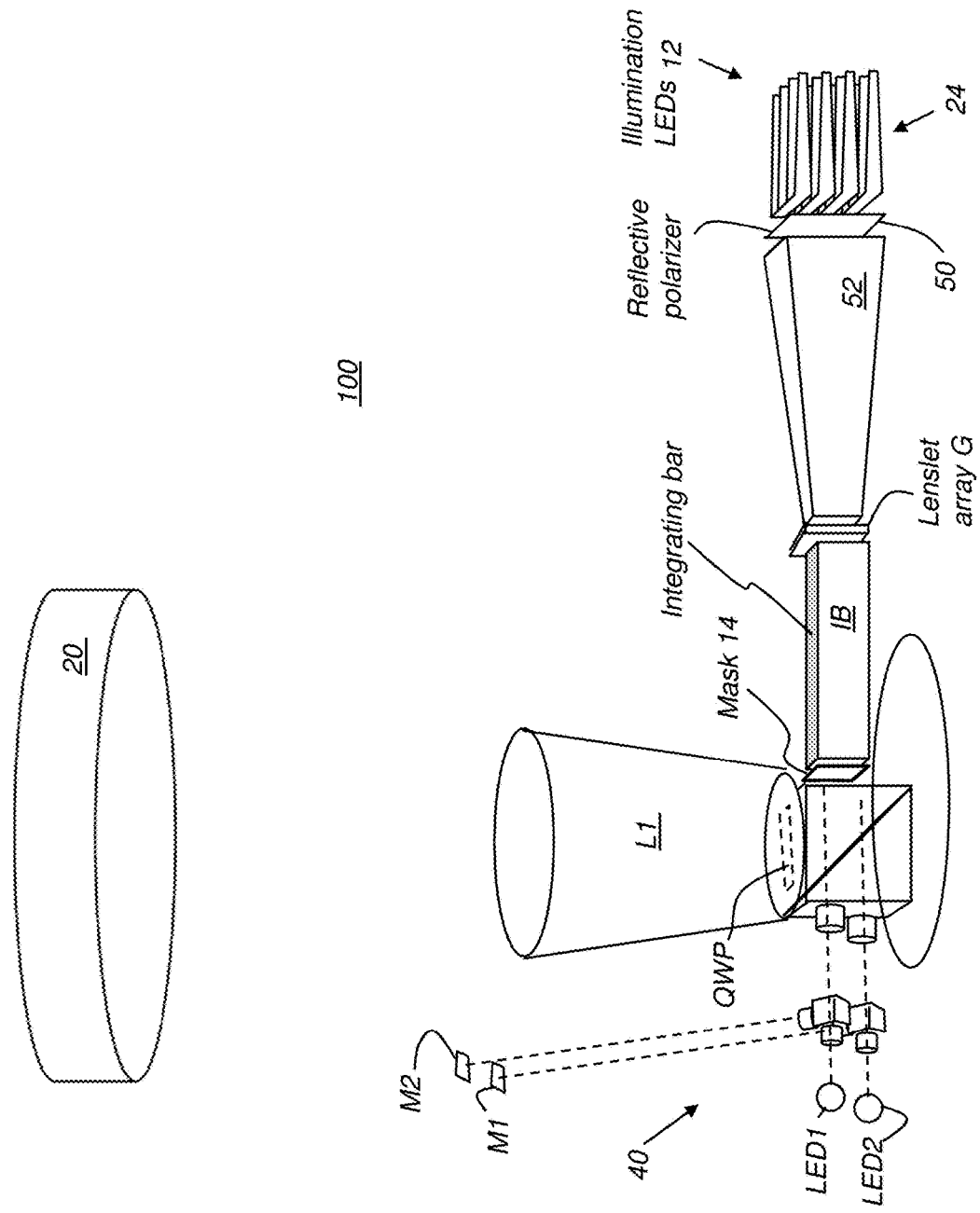
FIG. 2B is a perspective view showing components and light paths for the lithographic imaging system, with alignment light sources illuminating the front of the mask.

Referring to the schematic arrangement of FIG. 2B, illumination source 12 can have an array of LEDs. An optic array 24 of tapered bars or cones, one for each LED light source, guides the generated actinic light to an optional reflective polarizer 50 and to a tapered light guide 52. A lenslet array G and an integrating bar D3 uniformize and condition the illumination beam. Integrating bar D3 improves near-field uniformity for light from the illumination source; lenslet array G improves far-field uniformity at the system's aperture stop that is located at concave mirror 20. Various optical elements in FIG. 2B, such as light guide 52 and array of tapered cones 24, are shown spaced apart for clarity. In practice, elements 52, 24, and reflective polarizer 50 can be cemented to each other or otherwise disposed in optical contact with each other.

For precision in wafer lithography, the mask 14 is aligned to the wafer following the indexing procedure using an alignment light source, such as a source emitting visible light. FIG. 2B shows a schematic side view of optical system 100 having an alignment apparatus 40. Alignment apparatus 40 has visible or near-visible alignment light sources LED1, LED2 and microscope or camera sensors M1, M2 for viewing mask-to-wafer alignment, described subsequently by way of example in more detail. Sources LED1 and LED2 are of relatively low power, emitting light at wavelengths distinct from the actinic wavelengths of the high-energy illumination LEDs of source 12 that are used for lithographic exposure. The respective wavelength bands used for illumination source 12 and alignment apparatus 40 are non-overlapping. According to an embodiment of the present disclosure, the alignment light used in apparatus 40 is visible light, at wavelengths above 440 nm and below 720 nm. Where electronic sensing is used, wavelengths outside the visible range may be employed for alignment light, such as light in the infrared (IR) range exceeding 700 nm.

By eliminating the prisms P1, P2 of the conventional optical system 10 shown in FIG. 1E, the use of polarization splitting shown in optical system 100 significantly reduces the field requirements of the optics and allows a more compact optical design for the exposure illumination system in comparison with conventional approaches.

Compensation

Figure 3A:
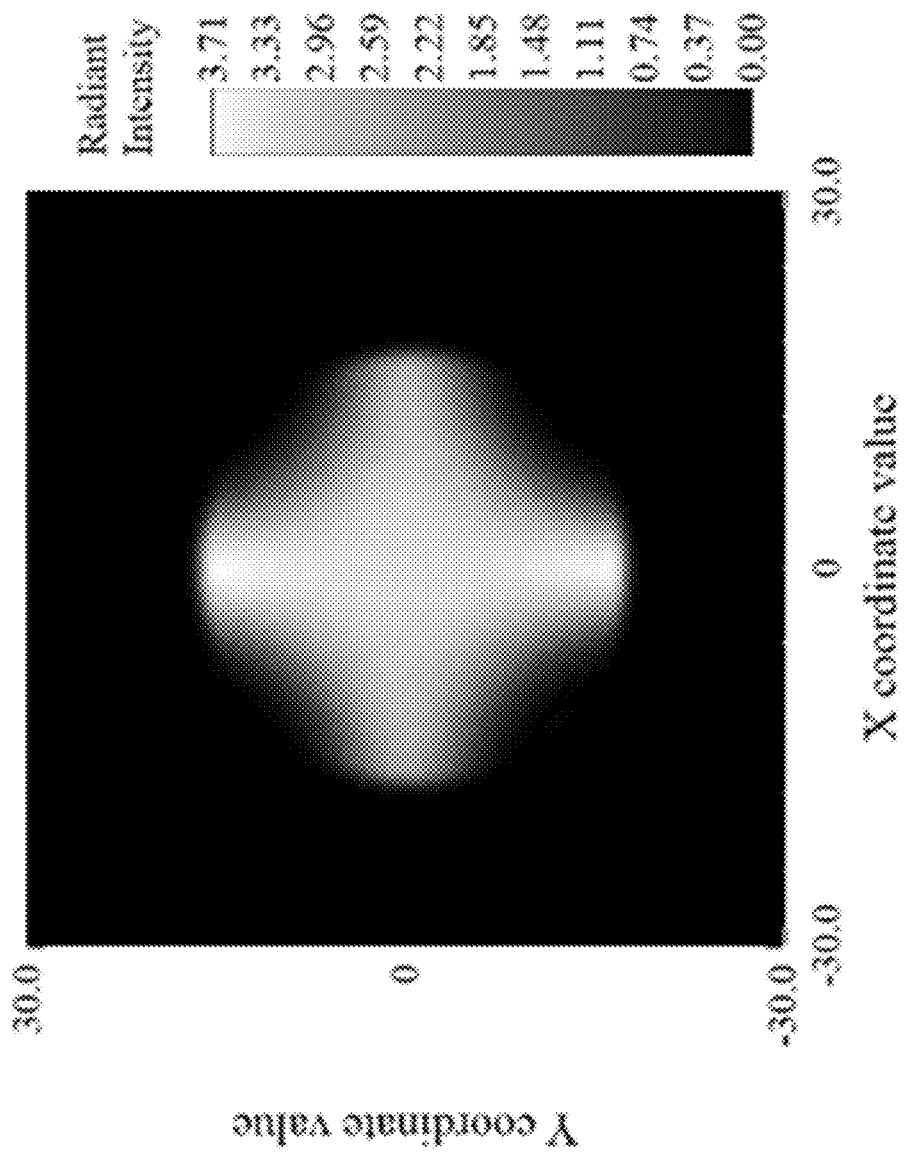
FIG. 3A shows the non-uniform illumination intensity detected at the exposure aperture induced by a quarter wave plate QWP.

The Applicants have found, however, that in some cases the use of polarization splitting introduces problems not anticipated in other previous attempts to reduce the field size requirements by folding the optical path. When the PBS/QWP combination shifts the polarization of the exposure illumination, an aperture polarization aberration that affects light uniformity can result. FIG. 3A shows the uncorrected non-uniform illumination light intensity detected at the system aperture. In the Dyson system, the aperture can be considered as illumination distribution at the reflecting mirror 20 (FIG. 2B). The aperture can equivalently be expressed as the angular distribution of the light that exposes the wafer.

In FIG. 3A the light distribution at the aperture is considered in the angular range of ±30 degrees at the wafer. The illuminated range in the x direction is ±18 degrees, for the system shown having a numerical aperture of 0.3. FIG. 3A shows a characteristic pattern of non-uniform aperture illumination distribution, sometimes termed a "Maltese cross" which causes undesirable resolution loss. In practice, for accurate lithography, every position along the mask should receive an equivalent distribution of light energy from every angular position of the aperture. Vignetting, in which a portion of the aperture does not direct illumination to a portion of the mask, would be undesirable. A vignetting pattern such as the "Maltese cross" of FIG. 3A will degrade the MTF (Modulation Transfer Function) of the system when imaging diagonal features on the mask.

Figure 3B:
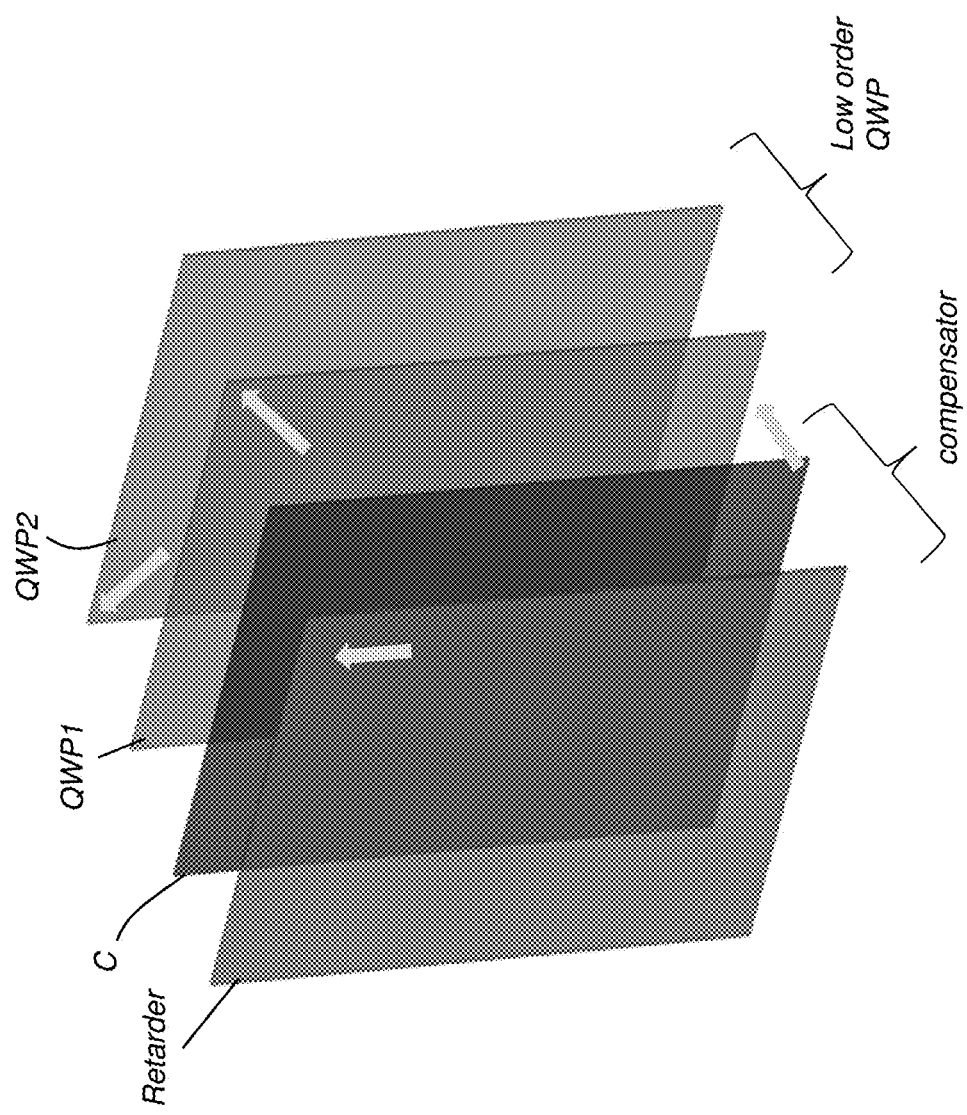
FIG. 3B shows the use of a QWP compensator to address the non-uniform intensity problem.

The schematic representation of FIG. 3B shows, from the perspective of an unfolded illumination light path, the Applicants' solution to the aperture non-uniformity problem according to an embodiment of the present disclosure. FIG. 3B shows four elements in two groups. One group is the low order quarter wave plate QWP. This group has two QWPs at 90 degrees to each other; this pair is known in the art as a low order QWP. The other group in FIG. 3B is the compensator group. It is comprised of a "negative C plate" and an "A plate" or retarder. The term "negative C plate", means a birefringent plate having three index of refraction values where $n_x = n_y > n_z$. The term "A plate" denotes a retarder that is rectilinear with the system x and y coordinates; with this orientation, the A plate does not affect y polarized light on axis, for example. The compensator group corrects for the non-uniform illumination distribution with respect to the aperture.

Figure 3C:
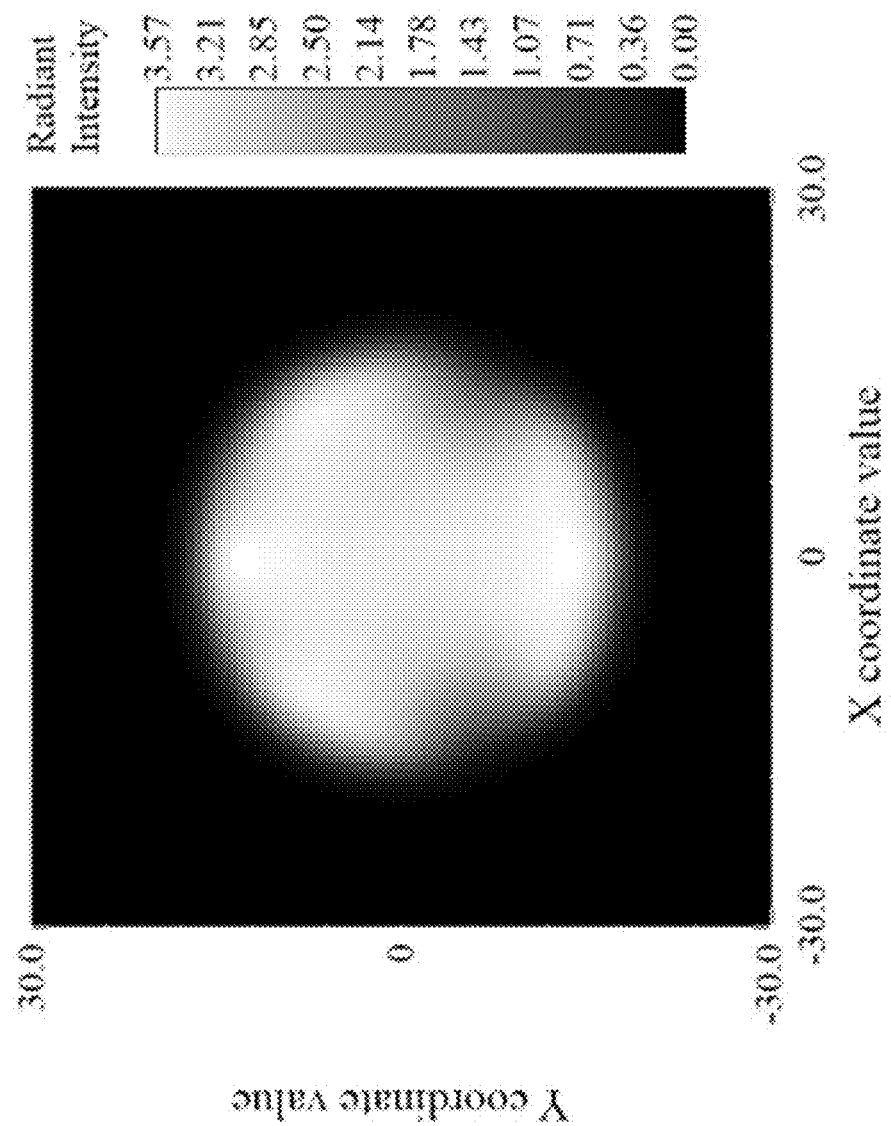
FIG. 3C shows aperture intensity after QWP compensation.

Using the FIG. 3B arrangement, an embodiment of the present disclosure provides compensation to the low order QWP using a negative C plate and an A plate to alleviate the Maltese cross problem. FIG. 3C shows the light distribution of the system aperture when the QWP compensator is used and the Maltese cross pattern shown on FIG. 3A is corrected.

It should be noted that, in many generalized optical applications, a uniform field is required, so that light intensity or energy is well distributed across the field. For lithography applications, however, in addition to having uniform energy distribution over the field, it is also necessary to provide uniform angular distribution of illumination energy from the aperture to each point on the mask.

Quarter wave plates QWP1 and QWP2 can be quite thick, on the order of 0.5 to 2 mm, as long as the difference between their respective thicknesses is such that the rotational retardation they impart is a quarter wave, or ¾ of a wave, up to about ⅞ of a wave. In general, thick quarter wave plates are easily manufacturable. However, it is also possible to obtain suitable far-field uniformity using one thin QWP1, without the need for QWP2, and to forgo the compensator if QWP1 is thin enough, such as on the order of less than 100 microns, and if QWP1 itself induces the rotational retardation of ¼ wave or ¾ wave, up to about ⅞ wave.

Alignment Light Path

Figure 4B:
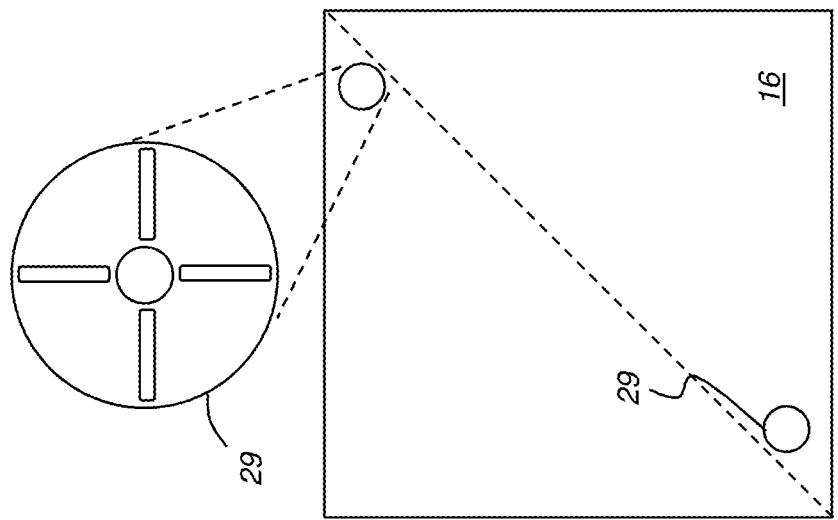
FIG. 4B shows a wafer having alignment fiducials near diagonal corners of the imaging field.
Figure 4A:
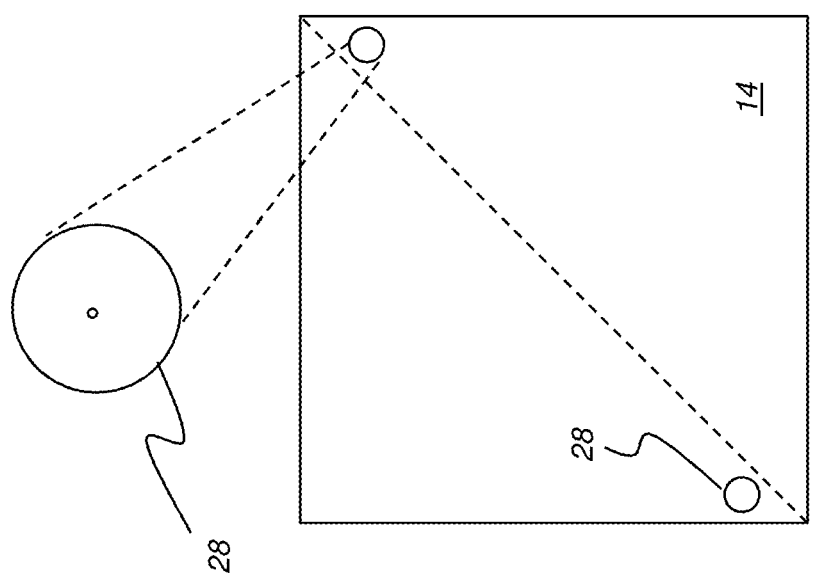
FIG. 4A shows a mask having alignment fiducials near diagonal corners of the imaging field.
Figure 4D:
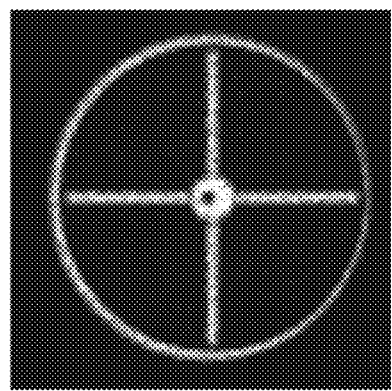
FIG. 4D shows appearance of fiducials according to another exemplary embodiment of the present disclosure, with some misalignment perceptible.

As the wafer 16 is positionally incremented to each exposure position (FIG. 2A), precise alignment can be used to check and help correct for slight registration errors. FIG. 4A shows mask 14 having alignment fiducials 28 near diagonal corners of the imaging field, with one of fiducials 28 shown enlarged. These fiducials 28 must align with corresponding fiducials 29 on the wafer 16 as shown in FIG. 4B in order to indicate suitable alignment. Fiducials 28, 29 are markings or other features on the corresponding mask 14 or wafer 16 that are treated to reflect at least a detectable portion of the incident alignment light back through the optical system for verification of suitable alignment. The fiducials 28, 29 impart a pattern onto the reflected alignment light, as shown in the examples of FIGS. 4C and 4D.

A diagonal is shown through mask 14 in FIG. 4A, with a corresponding diagonal for wafer 16 in FIG. 4B. The respective fiducials 28 and 29 can be slightly offset with regard to the diagonal of the mask shape, in order to help prevent crosstalk between alignment channels.

Figure 4C:
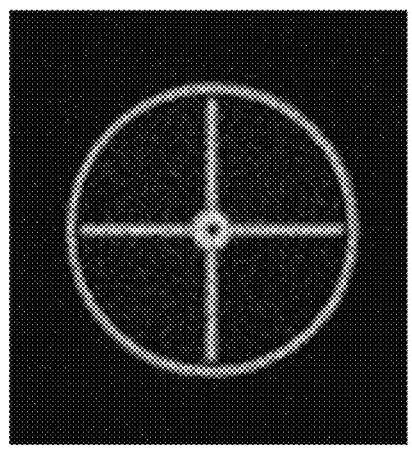
FIG. 4C shows appearance of fiducials according to an exemplary embodiment of the present disclosure.

By way of example, FIG. 4C shows how fiducials from mask 14 and wafer 16 overlap and cooperate as an indicator of alignment. FIG. 4C indicates acceptable alignment. FIG. 4D shows the appearance of fiducials when alignment is poor, with a center dot offset from its desired position.

As noted previously, visible light, or some other light outside the actinic UV exposure illumination wavelength range, can be used for mask-to-wafer alignment. In order to provide sufficient spectral separation of the alignment light from the exposure illumination, the LED alignment light can be visible Green light in the nominal 510 nm wavelength range. Fiducials are shown by way of example only, and not by way of limitation; a variety of fiducial shapes and arrangements can be used for the respective wafer and mask fiducials.

Figure 4F:
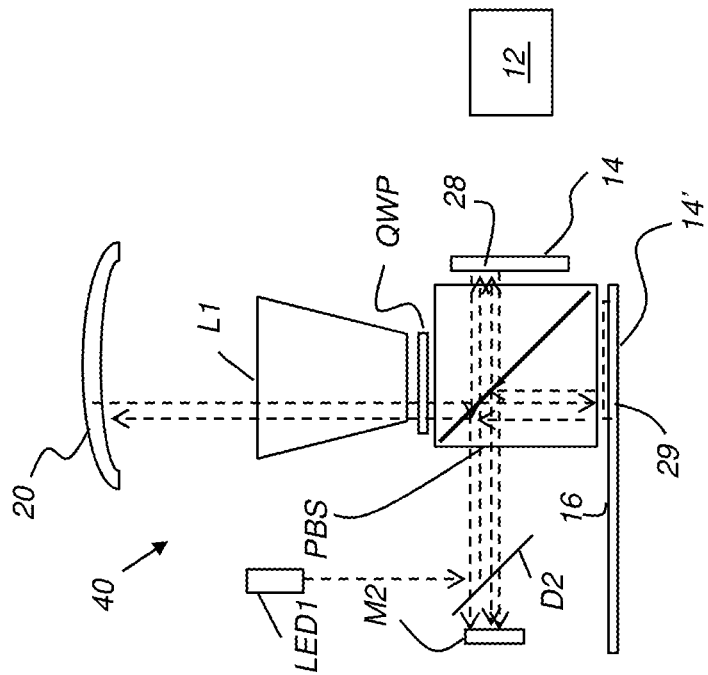
FIGS. 4E and 4F show exemplary light paths for exposure illumination and alignment light, respectively.
Figure 4E:
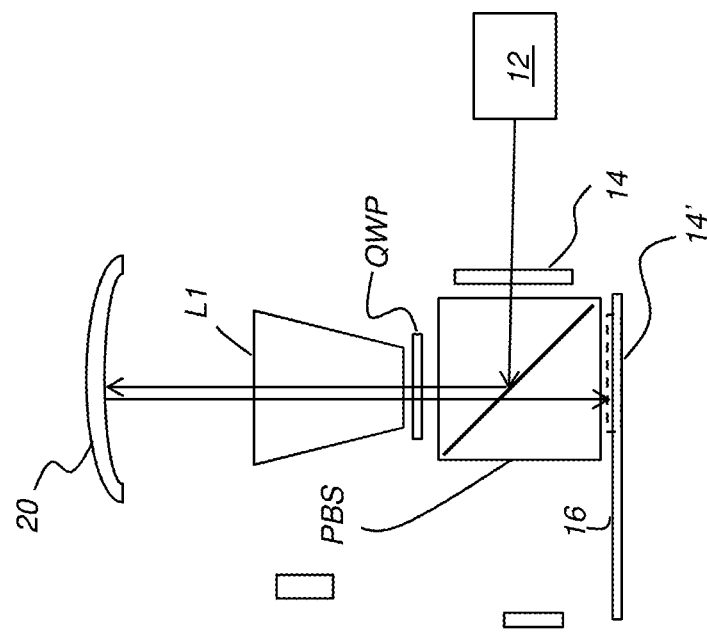

The light path for optical alignment shares large portions of the light path that is employed for the illumination beam. FIGS. 4E and 4F compare these two partially overlapping light paths in schematic form. FIG. 4E shows the path of the exposure illumination beam. As shown in FIG. 4E, polarized UV illumination from the energized illumination source 12 is directed through mask 14 which imparts the exposure pattern to the illumination beam. The PBS defines an illumination path for the polarized exposure illumination beam that conveys the beam through QWP and lens L1 and toward concave mirror 20. The QWP changes the polarization by 90 degrees, such as from linear to circular. Light reflected from mirror 20 returns along this path; the second transit through QWP changes its polarization so that it is orthogonal to the emitted light from source 12. This light is then directed to the exposure plane on the wafer 16 surface.

FIG. 4F shows the path that is defined for each alignment light channel of alignment apparatus 40, with the LED1 path shown by way of example. The light from LED1 is directed by a beam splitter D1 toward the PBS. The PBS is conditioned to act as a 50/50 beam splitter for light at the non-actinic alignment wavelength. Thus, one portion of the light is directed toward the fiducial 28 on mask 14. A portion of the light reflected from the fiducial 28 on mask 14 is reflected back toward the PBS and to concave mirror 20, then onto a corresponding fiducial 29 on wafer 16. This light, now patterned, bearing the overlapping images of the mask and wafer fiducials 28 and 29, is partially reflected by the PBS and directed through beam splitter D2 to sensor M2. LED1 illuminates the mask 14 fiducial; since the Dyson arrangement has a magnification of 1.0, the image of the fiducial faces the sensor, which senses the other corner of the mask. The relative registration of the two fiducials at sensor M2 then gives an accurate guide to alignment of mask 14 with wafer 16.

It should be noted that the significant light losses for the visible light, due to the behavior of the UV PBS as a 50/50 beam splitter for the 510 nm Green alignment light, do not compromise alignment capability; sufficient light is available at sensors M1, M2 for alignment purposes. It should also be noted that different wavelengths can be used for alignment light within each respective alignment apparatus 40A, 40B (FIG. 5B). Use of different LED wavelengths can allow spectral separation of the alignment light channels in order to avoid crosstalk. In practice, a spectral separation of at least 40 nm between nominal values for LED1 and LED2 alignment light sources would effectively render their respective wavelength ranges as non-overlapping, as this description would be applied by those skilled in the optical signal sensing art for solid state light emitters, and would allow optional filters FL1 and FL2 to be designed for each alignment channel, as shown in dashed outline in FIG. 5B.

Figure 5A:
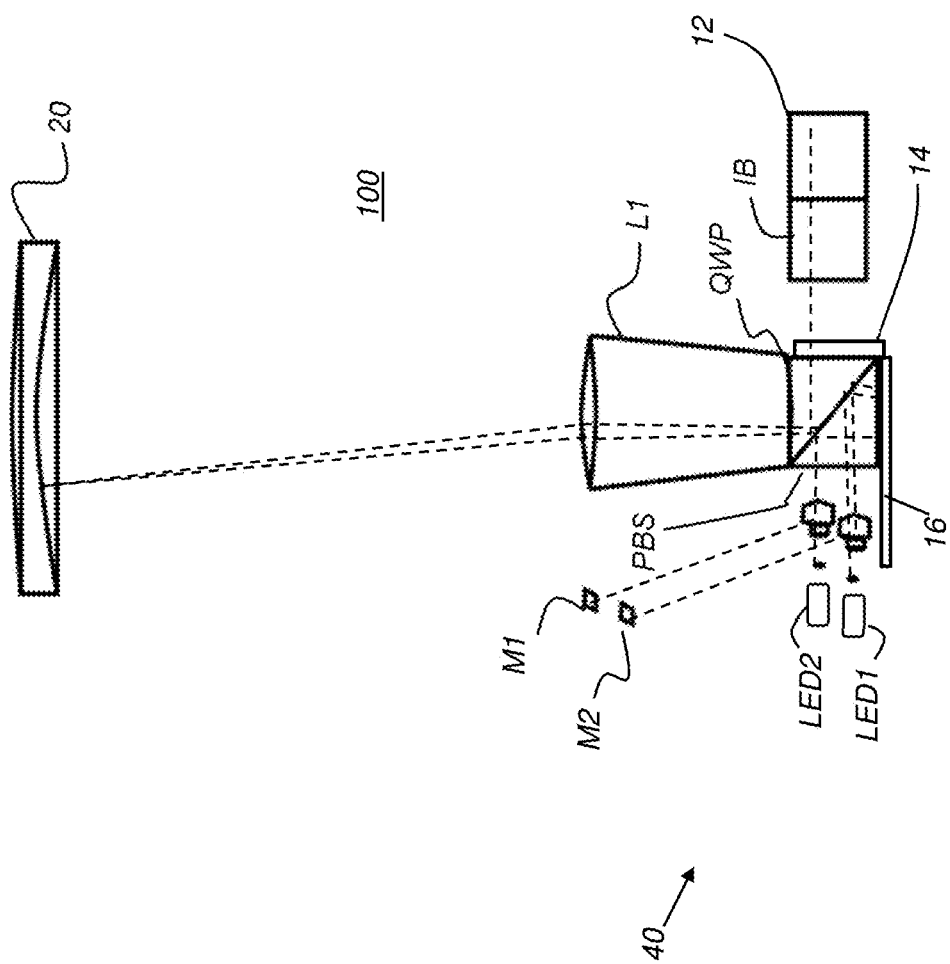
FIG. 5A shows a perspective view of an alternate embodiment of the projection optical system for wafer exposure having an alignment apparatus with alignment light from the front side of the mask.
Figure 5B:
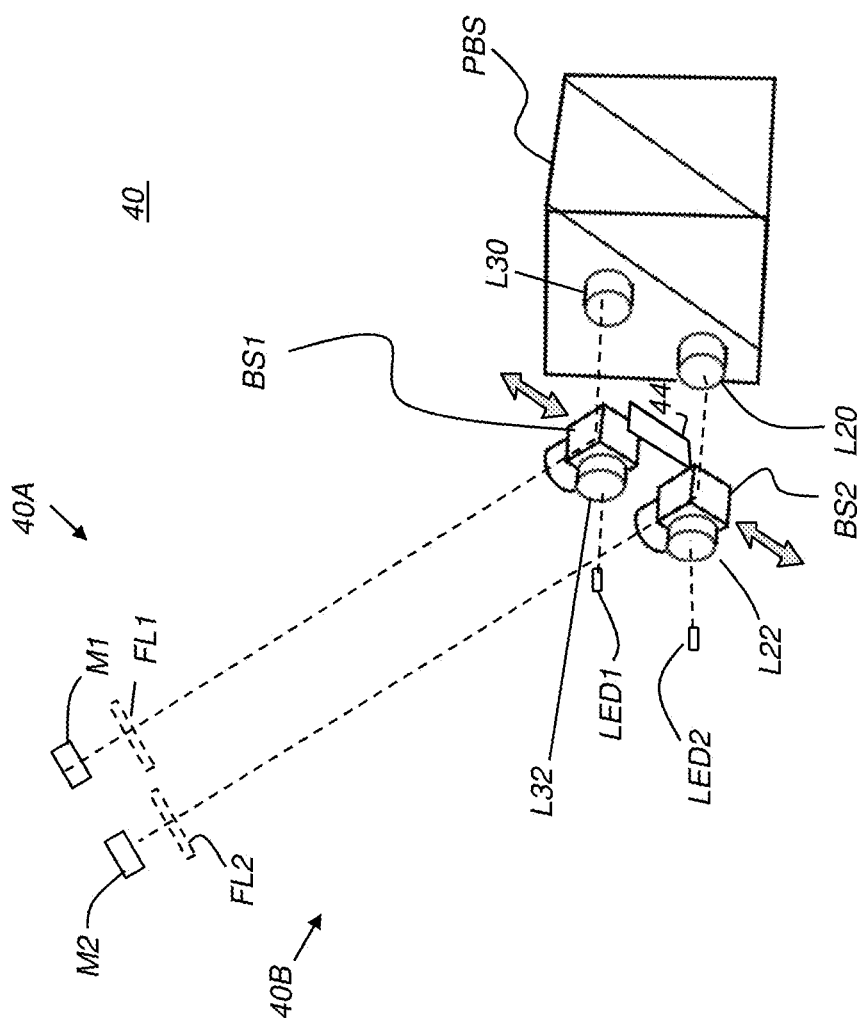
FIG. 5B shows an enlarged view of alignment apparatus components.

FIG. 5A shows an embodiment of projection optical system 100 in which alignment apparatus 40 directs illumination to the front surface of mask 14 for alignment. The alignment apparatus 40 employs the light path arrangement previously described with reference to FIG. 4F for light to both sensors M1 and M2. (The positions of sensors and LEDs in FIG. 5A are interchanged with respect to those shown in FIG. 4F. Either configuration can be used equivalently.) The alignment light can alternately be combined with the illumination light in a "rear illumination" arrangement with respect to mask 14; this alternate arrangement (not shown) would require an additional beam splitter or other combiner for directing alignment light through mask 14.

The alignment system can be easily adjustable to accommodate different mask sizes. For example, if a smaller mask is used with the mask fiducials closer to each other, and the corresponding wafer fiducials are also correspondingly closer, then the two alignment beams can be adjusted to match the smaller separation between the fiducials.

FIG. 5B shows an enlarged isometric view of the alignment sensing optics and positioning adjustment available with alignment apparatus 40 according to an embodiment of the present disclosure. Components are vertically rotated from the schematic arrangement shown in FIG. 5A. In an alignment apparatus 40A for a first alignment channel, LED1 directs light through a lens L32 to beam splitter BS1; this light continues through a lens L30 and to the PBS which acts as a 50/50 beam splitter for alignment functions. In an alignment apparatus 40B for a second alignment channel, LED 2 similarly directs light through a lens L22 to a beam splitter BS2; this light continues through a lens L20 and to the PBS. A portion of the returning light from the mask and wafer is reflected through the corresponding beam splitters BS1 and BS2 for viewing or otherwise sensing at sensors M1, M2, as previously described with respect to FIG. 4F. A separation adjustment apparatus 44 allows the distance between the respective alignment channels to be adjusted, such as to accommodate different mask dimensions, for example. Separation adjustment apparatus 44 can be a suitable positional adjustment mechanism, such as a turnscrew, slide, or other device for re-positioning components of the respective alignment apparatus 40A, 40B, such as changing spacing between channels, as indicated by arrows in FIG. 5B.

In order to protect against crosstalk between the two alignment channels, the fiducials 28 and 29 for the mask and wafer can be positioned asymmetrically with respect to the mask and illuminated wafer surface, as described previously with relation to FIGS. 4A and 4B. With this arrangement, alignment apparatus 40A and 40B are more effectively isolated from each other; stray light from the second alignment channel does not perceptibly interfere with the light detected in the first alignment channel.

Using the alignment apparatus described herein, four external surfaces of the polarization beam splitter PBS are used for transmission of light energy in different directions. The alignment apparatus 40A and 40B can be separated and housed on one side of the PBS, with the exposure illumination apparatus components placed on the opposite side of the PBS.

Figure 6A:
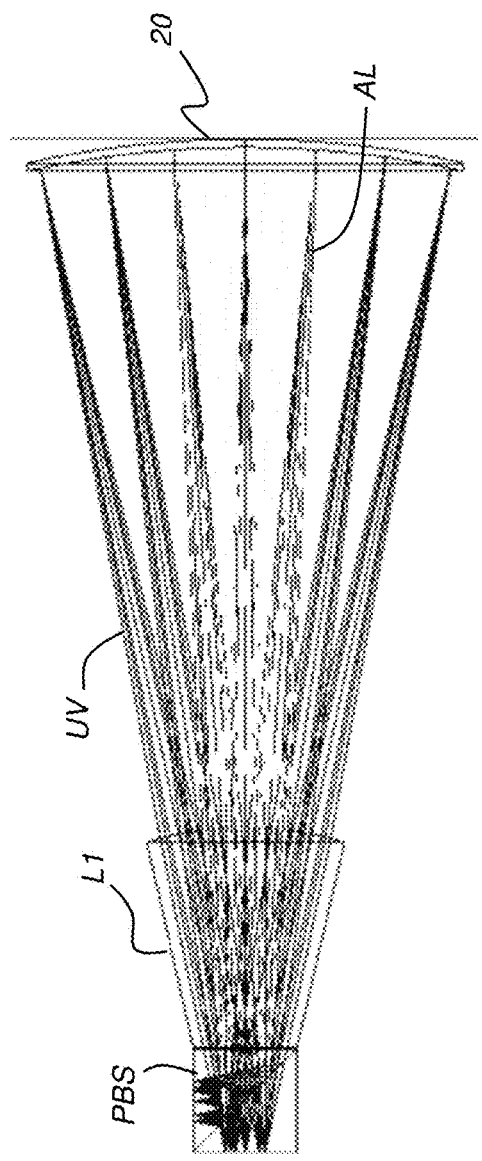
FIGS. 6A and 6B compare the UV exposure illumination at a higher NA with the LED alignment light at reduced NA.
Figure 6B:
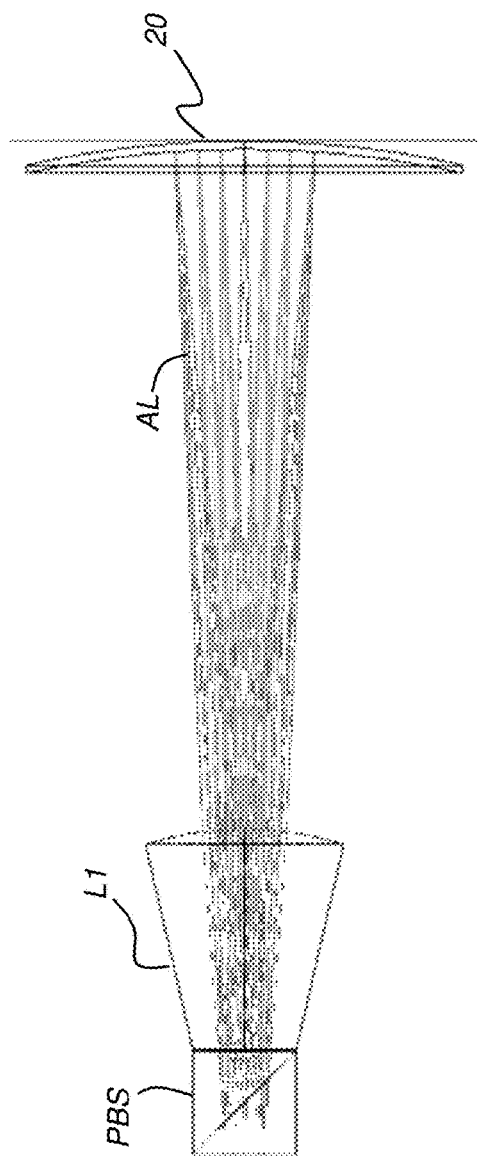
Figure 6C:
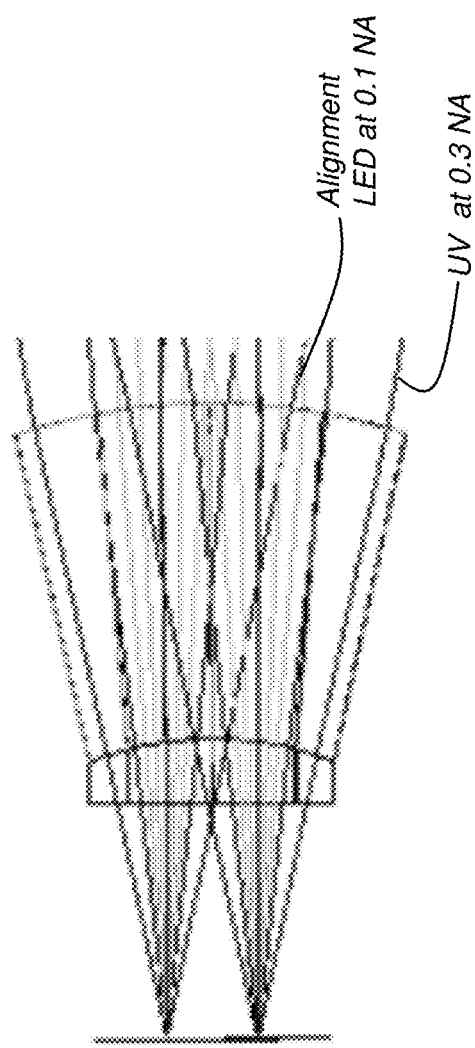
FIG. 6C shows the overlaid, unfolded light paths for LED alignment light and UV exposure illumination.

In order to simplify the optics and to avoid the need for additional color correction elements, the LED alignment light has a reduced numerical aperture NA compared against the UV exposure illumination. FIGS. 6A and 6B compare the UV exposure illumination at a higher NA, such as 0.3, with the LED alignment light at reduced NA, such as 0.1. FIG. 6C shows the overlaid, unfolded light paths for LED alignment light and UV exposure illumination.

According to an embodiment of the present disclosure, the numerical aperture of the actinic exposure illumination wavelength exceeds 0.25 and the numerical aperture of the alignment light beam is less than 0.15.

Leakage of light in the alignment optics path can alternately be prevented using LED modulation and camera shuttering. This allows individual viewing or sensing of each fiducial independently, without crosstalk from the other fiducial light. When, for example, LED 1 is energized, it directs light to the corner fiducial on mask 14. However, the alternate sensor M1 is shuttered or de-energized. This prevents light which directly reflects off the mask from this corner to be observed. The LED1 light reflects off the mask and is directed by the PBS towards mirror 20, and then arrives at the corner of the mask image on the wafer. This light images the mask fiducial on the wafer. The light then reflects off the wafer, carrying the combined images of the mask and the wafer fiducials, and is detected by sensor M2. At this point LED2 is energized and directs light to the other corner mask fiducial. Sensor M2 is shuttered and the two fiducials of the wafer and mask are detected by sensor M1.

Using the FIG. 2B or FIG. 5A embodiments, an in situ alignment system is obtained. There is no need to move the UV illumination source or its supporting optics out of the imaging path in order to insert LED1 and LED2 alignment light sources for alignment inspection. Microscope apparatus with microscope or camera sensors M1 and M2 can be optionally inserted and removed as needed or can be left in place where space permits.

Polarization beam splitter PBS plays a significant role in defining the optical paths along which the illumination and alignment energy are conveyed. The PBS is treated to perform a dual function, acting as a polarization gating device to direct the actinic UV illumination according to polarization state, and also acting as a 50/50 beam splitter for conveying visible light in the alignment channels.

The same glass type can be used for both L1 and PBS components. An obvious choice for handling the UV illumination is silica, which is relatively inexpensive and has excellent transmission in the UV range. However, there can be advantages in using different glass types for these components.

A first advantage in using different glass types relates to simplifying and enhancing PBS coating performance. Thus, the Applicants have found that, while it is still desirable to employ silica for the large L1 lens of FIG. 2A, there can be advantages to using a higher index glass for the PBS. According to an embodiment of the present disclosure, the PBS is formed using optical glass S-BSL7y, for example, which is of higher index and cost than silica, while still acceptably transmitting UV.

The Applicants have discovered another advantage with using different glass types, related to spherical aberration correction and component tolerancing requirements for lithography. In a conventional Dyson system as shown on FIG. 1A, the wafer and mask must be placed at very close proximity to the Dyson lens L1, with spacing between the optics and the substrate typically held to within a fraction of a mm. An increased gap tends to induce spherical aberration from the plano surface of lens L1. The spherical aberration could be corrected using an aspherical surface for mirror 20; however, this would add significant cost and complexity to the optical design.

Using optical system 100 according to the present disclosure, as shown in the example of FIG. 2A, with the original Dyson L1 lens replaced with lens L1 of silica and using the PBS with higher index glass for exposure beam folding, spherical aberration can be eliminated or reduced and the spacing requirements can therefore be relaxed, without the requirement to add aspherical terms to mirror 20 curvature. Thus, a notable advantage of using different glasses for the PBS and the L1 lens is that the gap requirements between the wafer 16 and the PBS, and similarly the gap between mask 14 and the PBS, can be relaxed from the constraints of conventional 1:1 Dyson imaging approaches. The resulting increase in gap allowance provides relaxed tolerances for mechanical positioning of the wafer 16 and mask 14. According to an embodiment of the present disclosure, the difference between optical indices for lens L1 and PBS substrates is at least 0.04. Using optical glasses with at least this difference in index relaxes the spacing requirements often made on 1:1 Dyson imaging systems so that, during lithographic imaging, mask 14 and wafer 16 can be spaced apart by more than 1.5 mm distance from the PBS. For example, with reference to FIG. 2A, exposure plane P that is defined by mirror 20, lens L1, and the PBS can be 1.5 mm or further from the facing surface S1 of the PBS.

The invention has been described in detail with particular reference to certain preferred embodiments thereof, but it will be understood that variations and modifications can be effected within the scope of the invention as described above, and as noted in the appended claims, by a person of ordinary skill in the art without departing from the scope of the invention.

The invention claimed is:

1. An imaging apparatus for exposing a pattern onto a substrate, the apparatus comprising:
    a) an illumination source that is energizable to generate a polarized exposure illumination beam of an actinic wavelength range;
    b) a mask disposed to impart the pattern to the polarized exposure illumination beam; and
    c) a polarization beam splitter that defines an illumination path that conveys the generated polarized exposure illumination beam through a quarter wave plate and plano-convex lens and toward a concave mirror,
    wherein the defined illumination path further conveys a reflected exposure illumination beam from the concave mirror through the same polarization beam splitter toward an exposure plane for exposing the imparted pattern onto the substrate,
    wherein the exposure plane is defined by the concave mirror, the plano convex lens, and the polarization beam splitter.

2. The apparatus of claim 1 further comprising at least a first and a second alignment apparatus, wherein each respective alignment apparatus images a respective mask fiducial, and wherein each respective alignment apparatus comprises:
    (i) an alignment light source energizable to form an alignment beam having an alignment wavelength range that lies outside the first wavelength range, and
    (ii) a beam splitter that cooperates with the polarization beam splitter to define an alignment path that conveys a portion of the alignment beam to a substrate fiducial feature on the substrate, to the concave mirror, to a mask fiducial feature on the mask, and to a sensor.

3. The apparatus of claim 1 wherein the plano-convex lens is in optical contact with the quarter wave plate and the quarter wave plate is in optical contact with the polarization beam splitter.

4. The apparatus of claim 1 wherein the plano-convex lens is formed from a first optical material having a first index of refraction and the polarization beam splitter is formed from a second optical material having a second index of refraction and wherein the first and second indices of refraction differ by more than 0.04.

5. The apparatus of claim 2 wherein each alignment light source is of a visible wavelength.

6. The apparatus of claim 2 further comprising a separation adjustment apparatus that adjusts a separation between alignment beams for the at least first and second alignment apparatus.

7. The apparatus of claim 1 wherein the generated polarized exposure illumination beam is of a first polarization state and wherein the reflected exposure illumination beam is changed to a second polarization state that is orthogonal to the first polarization state.

8. The apparatus of claim 1 further comprising a polarization compensator plate in the illumination path.

9. The apparatus of claim 1 further comprising an integrating bar for uniformizing near-field light from the illumination source.

10. The apparatus of claim 1 further comprising a lenslet array for uniformizing far-field light in the reflected exposure illumination beam.

11. The apparatus of claim 2 wherein the actinic wavelength range is below 380 nm and the alignment wavelength range is above 440 nm.

12. An imaging apparatus for exposing a pattern onto a substrate, the apparatus comprising:
   a) an illumination source that is energizable to generate a polarized exposure illumination beam of an actinic wavelength range below 380 nm;
   b) a mask disposed to impart the pattern to the polarized exposure illumination beam;
   c) a polarization beam splitter disposed to reflect the patterned exposure illumination beam toward a concave mirror;
   d) a quarter wave plate in the path of the patterned reflected exposure beam reflected from the polarization beam splitter and reflected back from the concave mirror;
   wherein the polarization beam splitter further conveys the reflected exposure illumination beam from the concave mirror toward an exposure plane for exposing the imparted pattern onto the substrate,
   wherein the exposure plane is defined by the concave mirror, the plano convex lens, and the polarization beam splitter; and
   e) an alignment apparatus comprising:
      (i) an alignment light source energizable to form an alignment beam having an alignment wavelength range outside the actinic wavelength range, and
      (ii) a beam splitter that cooperates with the polarization beam splitter to define an alignment path that conveys a portion of the alignment beam to a substrate fiducial on the substrate, to the concave mirror, to a mask fiducial feature on the mask, and to a sensor.

13. The apparatus of claim 12 wherein the numerical aperture of the actinic illumination beam exceeds 0.25 and the numerical aperture of the alignment beam is less than 0.15.

14. The apparatus of claim 12 wherein the exposure plane is further than 1.5 mm from a facing surface of the polarization beam splitter.

15. A method for lithographic imaging comprising:
   a) generating a polarized exposure illumination beam of an actinic wavelength range;
   b) imparting a pattern onto the exposure illumination beam using a mask;
   c) directing the patterned polarized exposure illumination beam from a first surface of the polarization beam splitter that is in optical contact with a quarter wave plate and through a plano-convex lens that is in optical contact with the quarter wave plate, and toward a concave mirror,
   wherein the concave mirror, plano-convex lens and polarization beam splitter define an exposure plane for the illumination beam reflected from the mirror; and
   d) directing a first alignment light beam of a first alignment wavelength range outside the actinic wavelength range toward the polarization beam splitter, wherein the polarization beam splitter is treated to direct a first portion of the incident first alignment light toward a first mask fiducial provided by the mask and to direct light reflected from the first mask fiducial toward a first alignment sensor and further directs a second portion of the incident first alignment light toward a corresponding first wafer fiducial and back toward the first alignment sensor.

16. The method of claim 15 further comprising:
   d) directing a second alignment light beam of a second alignment wavelength range outside the actinic wavelength range toward the polarization beam splitter; and
   e) sensing the second alignment light beam reflected from a second mask fiducial and from a second wafer fiducial at a second alignment sensor.

17. The method of claim 16 wherein the first and the second alignment wavelength ranges are the same.

18. The method of claim 16 wherein the first and the second alignment wavelength ranges are non-overlapping.

19. The method of claim 16 comprising providing a separation adjustment apparatus for adjusting a spacing between the first and second alignment sensors according to a distance between the first and second mask fiducials.

* * * * *